United States Patent [19]

Ogi et al.

[11] 4,135,600

[45] Jan. 23, 1979

[54] LOUDSPEAKER SYSTEM

[75] Inventors: Kenji Ogi; Masakatsu Sakamoto, both of Tokyo, Japan

[73] Assignee: Trio Kabushiki Kaisha, Tokyo, Japan

[21] Appl. No.: 758,757

[22] Filed: Jan. 12, 1977

[30] Foreign Application Priority Data

Jan. 19, 1976 [JP] Japan ................................ 51-4364[U]

[51] Int. Cl.² .................................................. H05K 5/00

[52] U.S. Cl. ...................................................... 181/156

[58] Field of Search ................................ 181/144–156, 181/185, 199, 224, 256, 196

[56] References Cited

U.S. PATENT DOCUMENTS

| | | | |
|---|---|---|---|
| 2,065,751 | 12/1936 | Scheldorf | 181/151 |
| 2,810,448 | 10/1957 | Van Dijck | 181/154 |
| 2,990,906 | 7/1961 | Audette | 181/256 |
| 3,568,791 | 3/1971 | Luxton | 181/224 |
| 3,684,051 | 8/1972 | Hopkins | 181/199 |

FOREIGN PATENT DOCUMENTS

| | | | |
|---|---|---|---|
| 423291 | 7/1947 | Italy | 181/156 |

*Primary Examiner*—Stephen J. Tomsky
*Attorney, Agent, or Firm*—Gerald J. Ferguson, Jr.; Joseph J. Baker

[57] ABSTRACT

A loudspeaker system has a cabinet in which a loudspeaker is mounted, the cabinet supporting therein a hollow duct which provides sound communication between the exterior and interior of the cabinet. A standing wave prevention member made of a sound absorbent material is disposed within the duct in spaced relation thereto, the member being smaller in volume than the duct.

1 Claim, 15 Drawing Figures

LOUDSPEAKER SYSTEM

CROSS-REFERENCE TO RELATED APPLICATIONS

This application is related to U.S. application Ser. No. 764,220, filed Jan. 31, 1977 by Kenji Ogi, et al. and entitled "Speaker System" and U.S. application Ser. No. 778,997, filed Mar. 18, 1977 by Akio Tanase and entitled "Speaker System".

BACKGROUND OF THE INVENTION

1. Field of the Invention

The present invention relates to a loudspeaker system, and more particularly to an improvement in a loudspeaker cabinet or enclosure of the bass-reflex type.

2. Discussion of the Prior Art

Loudspeaker systems of the bass-reflex design, such as shown in FIGS. 1A and 1B or FIGS. 2A and 2B of the accompanying drawings, have a cabinet or enclosure 10 in which loudspeakers 11 and 12 are mounted, sound waves radiating from the back of the loudspeaker cones within the cabinet being emitted out through a hollow rectangular parallelopipedal duct or port 13, or a hollow cylindrical duct or port 14 supported in the cabinet 10, in which duct the phase of the sound waves is reversed.

With the conventional bass-reflex loudspeaker systems, there are produced in the ducts standing waves which make mid-range sounds unclear or cause peaks and dips to appear in the frequency characteristic. With a hollow rectangular parallelopipedal duct 13 dimensioned as shown in FIG. 3, for example, the frequencies of such standing waves can be calculated as follows:

$$f_1 = C/2l_1, f_2 = C/2l_2, f_3 = C/2l_3$$

in which $l_1$ = length [m] of the duct;
$l_2$ = width [m] of the duct;
$l_3$ = height [m] of the duct; and
C = speed [m/sec.] of sound in air As illustrated in FIG. 4, these standing waves $f_1$, $f_2$ and $f_3$ generate peaks and dips at different frequencies in the frequency response curve. It is known that among these standing waves, the one having the frequency $f_1$, which is generated in the longitudinal direction of the duct, most adversely affects the frequency characteristic of the system.

SUMMARY OF THE INVENTION

Accordingly, it is an object of the present invention to provide a bass-reflex type loudspeaker cabinet having means for eliminating standing waves in the duct to thereby obtain good mid-range reproduction and as flat a frequency characteristic as possible.

According to the present invention, a hollow duct in a loudspeaker cabinet of the bass-reflex type supports therein a standing wave prevention member made of a sound absorbent material. The member is smaller in volume than the duct, and is disposed coaxially within the duct in spaced relation. The absorbent member absorbs high frequency reflection waves in the hollow duct and prevents the generation of standing waves in the duct.

Other objects of the present invention will be apparent from the following description taken in conjunction with the accompanying drawings.

DETAILED DESCRIPTION OF THE PREFERRED EMBODIMENTS OF THE INVENTION

Figure 1A:
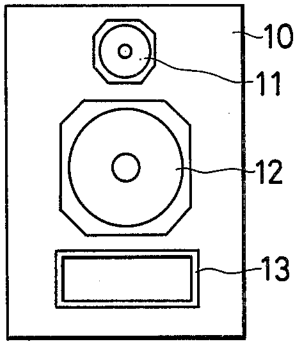
PRIOR ART FIG. 1A
FIG. 1A is a front elevational view of a conventional bass-reflex type loudspeaker system.
Figure 1B:
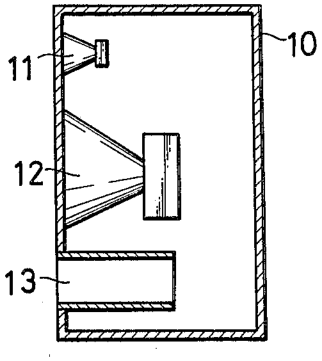
FIG. 1B is a vertical cross-sectional view of the loudspeaker system shown in FIG. 1A.
Figure 2A:
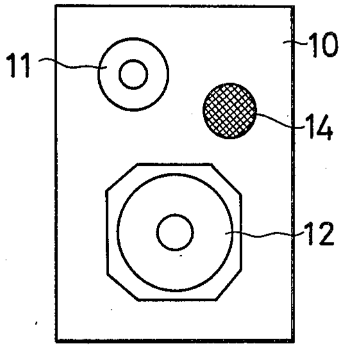
PRIOR ART FIG. 2A
FIG. 2A is a front elevational view of another conventional bass-reflex type loudspeaker system.
Figure 2B:
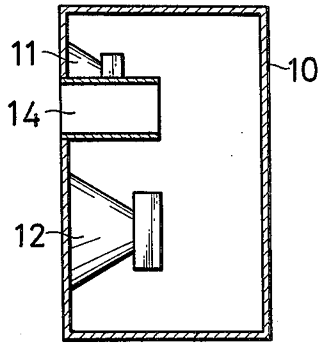
FIG. 2B is a vertical cross-sectional view of the loudspeaker system shown in FIG. 2A.
Figure 3:
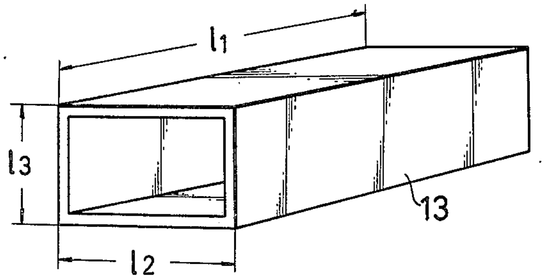
PRIOR ART FIG. 3
FIG. 3 is an enlarged perspective view of a prior art duct mounted in a loudspeaker cabinet of the bass-reflex type.
Figure 4:
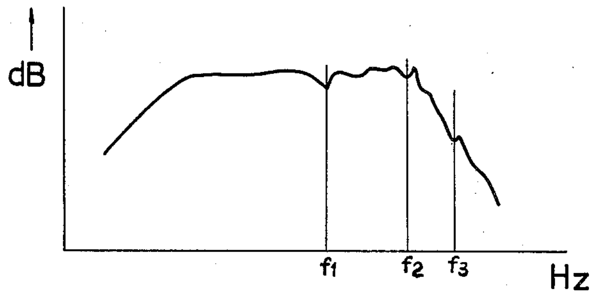
PRIOR ART FIG. 4
FIG. 4 is a graphical representation showing a frequency characteristic of a conventional bass-reflex loudspeaker system, the frequency characteristic being affected by standing waves.
Figure 5:
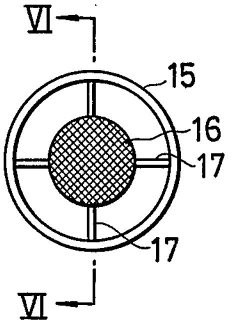
FIG. 5 is a front elevational view of a duct unit constructed in accordance with the present invention.
Figure 6:
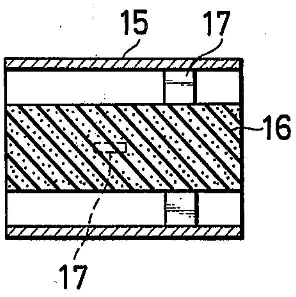
FIG.6 is a cross-sectional view taken along line VI—VI of FIG. 5.

In FIGS. 5 and 6, a duct unit of the invention comprises a hollow cylindrical duct 15 and a standing wave prevention member 16 in the form of a cylinder. The standing wave prevention member 16 has a diameter smaller than that of the cylindrical duct 15, and is disposed coaxially within the cylindrical duct 15 in spaced relation. The member 16 is substantially coextensive in length with the duct 15. The standing wave prevention member 16 is supported in place by means of a plurality of support wings 17 extending radially between the member 16 and the duct 15. The standing wave prevention member 16 is made up of an acoustic material or absorbent such as an urethane foam of low porosity, compressed acetate wool, or felt. The member 16 thus absorbs reflection waves of high frequencies in the hollow ducts, thereby preventing generation of standing waves, and at the same time reduces leakage of high frequency sound components through the duct 15.

Figure 12:
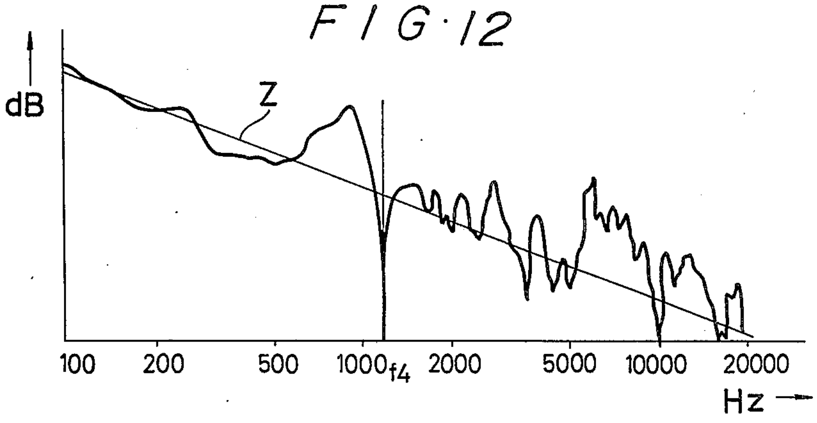
PRIOR ART FIG. 12
FIG. 12 is a graphical representation showing a sound pressure and frequency relationship provided within the duct of a prior art bass-reflex type loudspeaker system.
Figure 13:
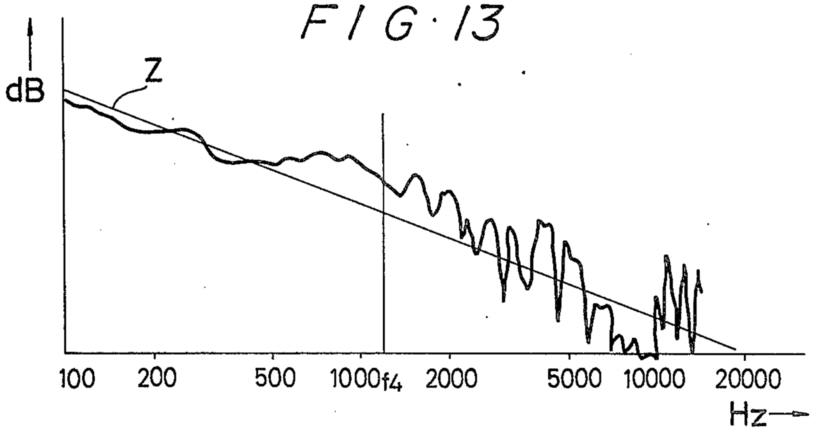
FIG. 13 is a graphical representation showing a sound pressure and frequency relationship provided within the duct of a bass-reflex type loudspeaker system of the present invention.

In FIG. 12, a relation is shown graphically between sound pressure and frequencies within a conventional duct in which no standing wave prevention member is provided. The curve was obtained with a duct having a length of 150mm and mounted in a loudspeaker cabinet having a woofer only. The line Z represents 6 [dB/oct]. In FIG. 13, on the other hand, a relation is shown graphically between sound pressure and frequencies within the duct unit illustrated in FIGS. 5 and 6. The duct unit also had a length of 150mm and was mounted in a loudspeaker cabinet having a woofer only. The line Z indicates 6 [dB/oct].

Upon comparison of the characteristic curve of FIG. 13 with that of FIG. 12, it will be understood that with the duct unit of the invention, there is no dip at a frequency $f_4$ near 1,200 Hz, which dip would otherwise be present as shown in FIG. 12. Furthermore, the curve illustrated in FIG. 13 is much more flat near frequency $f_4$ and, hence, is greatly improved.

Figure 7:
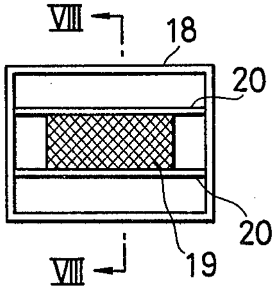
FIG. 7 is a front elevational view of a duct unit provided in accordance with a second embodiment.
Figure 8:
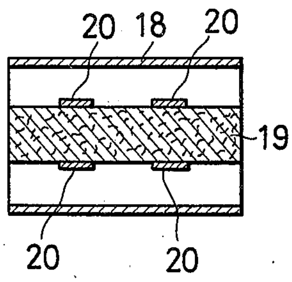
FIG. 8 is a cross-sectional view taken along line VIII—VIII of FIG. 7.

Referring now to FIGS. 7 and 8, a second embodiment comprises a hollow rectangular parallelopipedal duct 18 and a standing wave prevention member 19 in the form of a rectangular parallelopiped. The member 19 is substantially equal in length to, but smaller in width and height than the duct 18, and is disposed within the duct 18 in spaced relation. The member 19 is held in place by means of plurality of support wings 20 overlying and underlying the member 19, and extending widthwise of and within duct 18.

Figure 9:
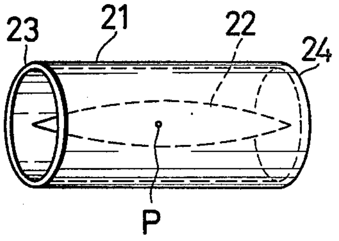
FIG. 9 is a perspective view of a third embodiment of the duct unit.
Figure 10:
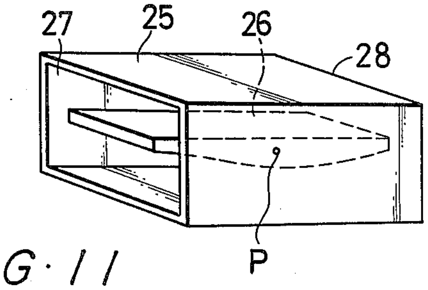
FIG. 10 is a perspective view of a fourth embodiment of the duct unit.

FIG. 9 illustrates a third embodiment having a hollow cylindrical duct 21 which supports concentrically therein a standing wave prevention member 22 of a streamline shape. The member 22 has substantially the same length as that of the duct 21, and is supported by any suitable means (not shown) such as the support wings 17 depicted in FIGS. 5 and 6. The member 22 has a maximum diameter at or near the longitudinal central point P of the duct 21 and a minimum diameter at the ends 23 and 24 of the duct 21. According to a fourth embodiment shown in FIG. 10, a hollow rectangular parallelopipedal duct 25 has therein a plate-like standing wave prevention member 26 supported by any suitable means (not shown) such as the support wings 20 illustrated in FIGS. 7 and 8. The member 26 is substantially equal in length to the duct 25, and has a thickness maximized at or near the longitudinal central point P of the duct 25 and minimized at or near the ends 27 and 28 of the duct 25. The arrangements shown in FIGS. 9 and 10 can prevent generation of the standing waves more effectively because the members 22 or 26 have a maximum diameter or thickness at or near the longitudinal central portion of the hollow duct 21 or 25, at which central portion the energy of the standing waves is concentrated.

Figure 11:
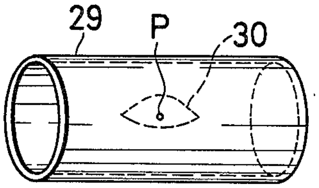
FIG. 11 is a perspective view of a fifth embodiment of the duct unit.

A fifth embodiment shown in FIG. 11 comprises a hollow cylindrical duct 29 and a standing wave prevention member 30 supported coaxially within the duct 29 in spaced relation by any suitable means (not shown). The member 30 has a length shorter than that of the duct 29, and has a diameter maximized at its longitudinal center and minimized at its ends, the center of the member 30 substantially corresponding in position to the longitudinal center P of the duct 29. With this structure, the overall size of the standing wave prevention member 30 is much smaller than the volume of the hollow duct 29 to avoid having the member 30 adversely affect the operation of the duct 29.

Additional advantages accruing from the structures of the invention is that removal of the standing waves can reduce unclear sounds in the middle frequency range which are inherent with bass-reflex type loudspeaker systems, and the standing wave prevention member made of an absorbent can decrease leakage through the duct of middle and high frequency sounds from the woofer to thereby extend the bass response. Furthermore, low frequency range and bass-reflex controls can be made by changing the shape and size of the standing wave prevention member.

Although the invention has been described with reference to certain specific embodiments thereof, numerous modifications falling within the scope of the invention are possible.

What is claimed is:

1. A bass-reflex loudspeaker system comprising a cabinet, a loudspeaker opening in said cabinet, a loudspeaker mounted over said opening in said cabinet, a further opening in said cabinet, a hollow duct mounted in said further opening and substantially extending into said cabinet, and a standing wave prevention member made of a sound absorbent material and disposed within and removed from the interior wall of said duct in spaced relation thereto, said standing wave prevention member being smaller in volume than said duct and comprising a solid cylinder with a diameter smaller than that of said hollow duct, the length of said solid cylinder being substantially as long as said hollow duct and being coaxially disposed and mounted therein.

* * * * *